April 12, 1960 B. BIRKENES ET AL 2,932,736

RADIO RECEIVER CIRCUIT

Filed Oct. 22, 1956

INVENTOR.
Bernhard Birkenes
Bjarne Anthun
BY
Mueller & Aichele
Attys.

2,932,736

RADIO RECEIVER CIRCUIT

Bernhard Birkenes and Bjarne Anthun, Chicago, Ill., assignors to Motorola, Inc., Chicago, Ill., a corporation of Illinois Application October 22, 1956, Serial No. 617,594
4 Claims. (Cl. 250—20)

This invention relates to radio receivers and more particularly to gain control systems as used to prevent overload of various stages in a receiver.

Most radio receivers, especially automobile sets, include an automatic gain control system to maintain a more uniform output as a user tunes among strong and weak stations or to quickly follow signal level changes as signal strength varies on a given station, e.g., when an auto is operated at a varying distance from the station or as it passes near a shielding structure such as bridge.

One form of present day automobile receivers operates directly from an auto electrical system which supplies a nominal 12 volts. This voltage may be used for energizing radio frequency, intermediate frequency and audio frequency stages without provision for voltage conversion or step-up. Such a receiver is described in the September 1956, issue of "Radio and Television News." In a receiver of this type, which is constructed to have high sensitivity for weak signal reception, the automatic gain control (AGC) system may not be strong enough to prevent distortion at high signal input levels. For example, the mixer-oscillator stage and the intermediate frequency amplifier stage could be overloaded thus causing distortion unless the gain of a preceding radio frequency amplifier is reduced greatly on strong signals. Considering that the mixer-oscillator and intermediate frequency amplifier tubes have only 12 volts on the anodes and that an automobile receiver may at times be operated near a station which could apply a signal of the order of one volt to the receiver antenna, it may be seen that only moderate further amplification of such a signal can produce a signal in the receiver having an amplitude which is a very great percentage of the B+ potential. Under such conditions one or more tubes in the receiver could be overdriven which would introduce nonlinearities and cause severe distortion.

Accordingly, it is an object of this invention to provide an improved gain control system for a radio receiver which system greatly reduces the signal output of a stage in the receiver at high signal input levels for minimizing distortion in the following stages.

Another object is to provide a simple circuit which furnishes a potential for supplementing the usual AGC potential developed in a radio receiver at high signal input levels without materially reducing the gain of the receiver at low signal levels.

A still further object is to provide a biasing system for a radio frequency amplifier in a low voltage receiver to reduce the gain of the amplifier at high signal levels and prevent distortion due to overloading of other stages of the receiver.

A feature of the invention is a provision of an improved variable gain radio frequency amplifier stage for a receiver operating directly from low voltage, including a signal rectifier in the radio frequency translating path for developing a bias to reduce the gain of the amplifier stage so that the following stages of the receiver are not overloaded at high signal input levels.

Another feature is the provision of a diode rectifier coupled between a tuned circuit and the input grid of a radio frequency amplifier tube so that radio frequency signals may be coupled to this grid on a negative axis for biasing the same according to signal strength. A resistor, series coupled with the diode, may be used to isolate this diode from the tuned circuit to prevent loading thereof while maintaining a direct current path to the input grid for the bias potential developed by the diode.

Still another feature of the invention is the provision of an electron valve connected as a cathode follower which is radio frequency coupled to the input of a radio frequency amplifier and in which cathode follower a self biasing network is incorporated for reducing the gain thereof as a signal input level increases to prevent overload distortion at high signal levels.

Further objects, features and the attending advantages of the invention will be apparent upon consideration of the following description when taken in conjunction with an accompanying drawing in which.

In brief, the invention provides a gain control system for the radio frequency amplifier stage of a radio receiver which is otherwise subject to overload at high signal input levels. A separate electron valve acts as a signal rectifier in the radio frequency stage to provide a bias for reducing the gain and supplementing an automatic gain control potential applied to the stage from a conventional "loop" AGC system which applies the potential from the detector stage in the receiver. In one form a diode rectifier circuit is coupled to the input grid of the radio receiver frequency amplifier tube so that a bias is developed by radio frequency signals to reduce the gain of the stage. When a tuned circuit is used to select signals applied to the amplifier stage, a resistor may be series-coupled with the diode for isolating purposes and reducing the loading effect of the tuned circuit for weak signals.

In a modified form of the invention a triode electron valve, coupled as a cathode follower, provides a radio frequency signal path to the input grid of the radio frequency amplifier stage. This grid may also be controlled by the usual automatic gain control potential for further gain regulation by reducing the signal input to the amplifier stage. The triode includes a self-biasing network in its input grid circuit so that it will be biased by radio-frequency signals for reducing the level of signals applied to the radio frequency amplifier tube thereby.

Figure 1:
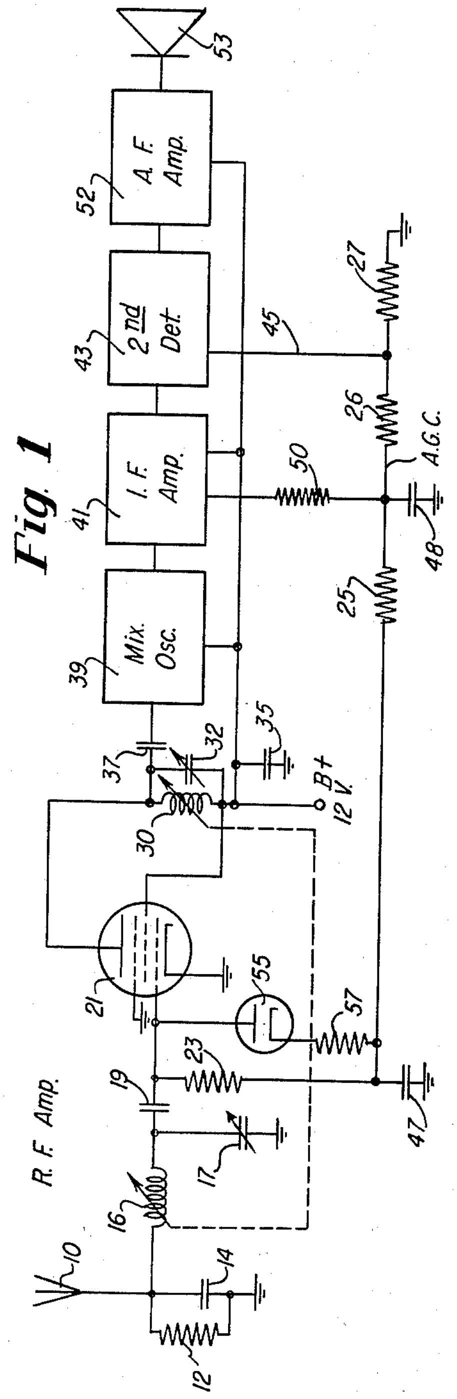
Fig. 1 is a schematic diagram of one form of the invention as it may be used with a radio receiver.

Considering now the automobile receiver shown in Fig. 1, it may be seen that the antenna 10 is connected to develop input signals across the parallel combination of resistor 12 and capacitor 14. Variable inductor 16 and variable capacitor 17 are connected across resistor 12 and elements 16, 17 form a tuned circuit resonant at the frequency of a desired signal. The selected radio frequency signal is applied from the junction of inductor 16 and capacitor 17 through capacitor 19 to the control grid of radio frequency amplifier tube 21. The cathode of tube 21 is connected to ground, as is the suppressor grid thereof. A D.C. return to ground for the control grid is provided by resistor 23 which is returned to ground through resistors 25, 26 and 27 in the automatic gain control (AGC) supply lead.

The output from amplifier tube 21 is taken from the anode which is connected through a parallel combination of variable inductor 30 and variable capacitor 32 to the B+ potential source. Elements 30, 32 are made variable and variable inductor 30 is shown ganged to variable inductor 16 so that both may be tuned to the frequency of an incoming signal. The B+ potential source is bypassed to ground for signal frequencies by means of capacitor 35. It may be noted that the potential source is denominated 12 volts which is the potential available directly from the electrical systems of many present day automobiles. As previously mentioned, it is contemplated that the receiver being described is operated directly from a 12 volt source in accordance with the teachings of the reference mentioned above.

The output signal developed across tuned circuit 30, 32 is applied through blocking capacitor 37 to mixer-oscillator stage 39 which heterodynes the incoming signal and produces a signal of intermediate frequency. It may be understood that a suitable tuned circuit may be included in stage 39 for adjusting the frequency of the local oscillator and that this may be ganged to variable inductors 16 and 30. The intermediate frequency signal is applied to intermediate frequency amplifier 41 wherein it is further selected and amplified and coupled to the second detector circuit 43 to be demodulated. Detector circuit 43 also produces a potential varying according to the carrier strength of the received signal, which potential is applied to lead 45 and developed across load resistor 27 as an AGC potential for the receiver. Resistor 25 and resistor 26 together with capacitors 47 and 48 form a filter network to remove radio frequency and audio frequency components of the AGC potential, which is applied through resistor 23 to the control grid of tube 21. This control potential is also applied to intermediate frequency amplifier stage 41 through resistor 50 in order to control the gain of this stage. The audio signals derived from detector circuit 43 are applied to the audio frequency amplifier 52 and from there to loudspeaker 53.

It may be noted that in operating the receiver of Fig. 1, as the signal strength on antenna 10 increases, for example, when the apparatus is relatively near a transmitting station, the AGC potential will have a comparatively large negative value thus driving the control grid of tube 21 negative to bias this tube and reduce the gain thereof. However, the antenna signal may be of the order of 1 volt or more under extreme conditions when the auto receiver is very close to a station, in which case the amplification of tube 21 may not be reduced sufficiently by the AGC potential to prevent severe overloading of the following stages, such as stages 39 and 41. In a receiver of this type, signal voltage swings at the output of a given amplifier stage may become a great percentage of the B+ (12 volts) energizing potential of the tubes which can easily cause operation in the non-linear regions and thus produce severe distortion of the signal. It is, of course, desirable to construct the receiver so that it has maximum sensitivity when it is desired to receive weak stations and therefore it may be appreciated that some provision should be made for automatically reducing the high level signals which may be applied to the antenna 10.

To accomplish this result, a diode 55, which may be of the vacuum tube or crystal form, is coupled in series with resistor 57 and the combination is connected across input resistor 23 of the radio frequency amplifier tube 21. The anode of the diode is thereby connected to the control grid of tube 21. Accordingly, at high signal levels the AGC potential from line 45 will be applied through resistor 23 to the control grid of tube 21 for some reduction of the gain of this tube. However, at high signal levels diode 55 will conduct to charge capacitor 19 which discharges through resistor 23 to further bias the control grid of tube 21. This rectifier action will greatly increase the effective AGC potential and cause a sufficient reduction in the signal level such that overloading of the subsequent stages and improper operation thereof will be obviated.

Resistor 57 is inserted in the cathode to AGC connection of diode 55 in order to prevent damping of the tuned circuit 16, 17 and reduction in the amplitude of weak signals. It is believed clear that diode 55 may also be included in the same envelope with vacuum tube 21 if there is adequate shielding between them.

In a circuit of practical construction the following circuit parameters were used and provided results according to the foregoing:

| | |
|---|---|
| Resistor 12 | 1.5 megohms. |
| Capacitor 14 | 90 micromicrofarads. |
| Capacitor 19 | 22 micromicrofarads. |
| Tubes 21 and 55 | DT 543 (Tung-Sol Electric Inc.). |
| Resistor 23 | 1.5 megohms. |
| Resistor 25 | 1 megohm. |
| Capacitors 47 and 48 | .05 microfarad. |
| Resistor 57 | 50,000 ohms. |

Figure 2:
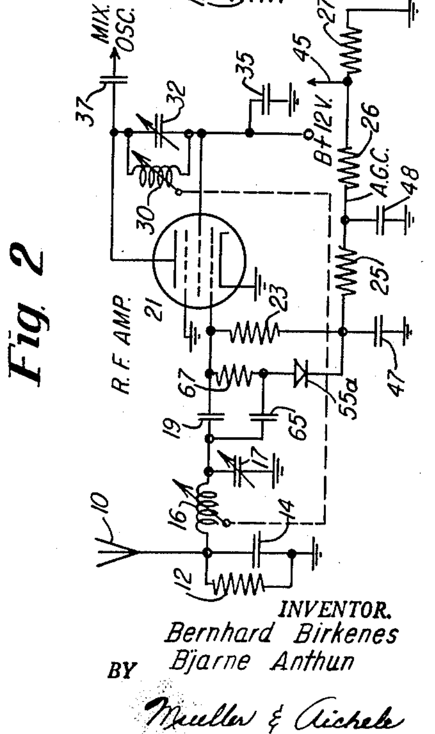
Fig. 2 is a diagram of a modification of the invention.

The circuit of Fig. 2 shows a modification of the invention wherein the components corresponding to those of Fig. 1 have been given the same reference characters. In this circuit, the input signal is applied to the control grid of tube 21 through capacitor 19 as in the previously described embodiment. However, the rectifying diode 55*a* derives its signal through a capacitor 65 coupled from the junction of inductor 16 and capacitor 17 to the anode thereof. The cathode is connected to the junction of resistors 23 and 25 and the cathode of the diode is isolated from the RF signal path by means of resistor 67.

In this circuit diode 55*a* charges capacitor 65 at high signal levels and this capacitor discharges through resistors 67 and 23 to apply the major portion of a negative control potential to the control grid of tube 21 for reducing the gain or amplification thereof. The function of resistor 67 is to prevent damping or loading of the tuned circuit 16, 17 when a weak signal is being received. The AGC potential is applied to the control grid of tube 21 through resistor 23.

In a practical construction of the invention, which includes essentially separate paths for feeding radio frequency signals to tube 21 and for feeding these signals to diode 55*a*, the following circuit constants were utilized:

| | |
|---|---|
| Capacitor 19 | 47 micromicrofarads. |
| Resistor 23 | 4.7 megohms. |
| Capacitor 65 | 22 micromicrofarads. |
| Resistor 67 | 100,000 ohms. |

Figure 3:
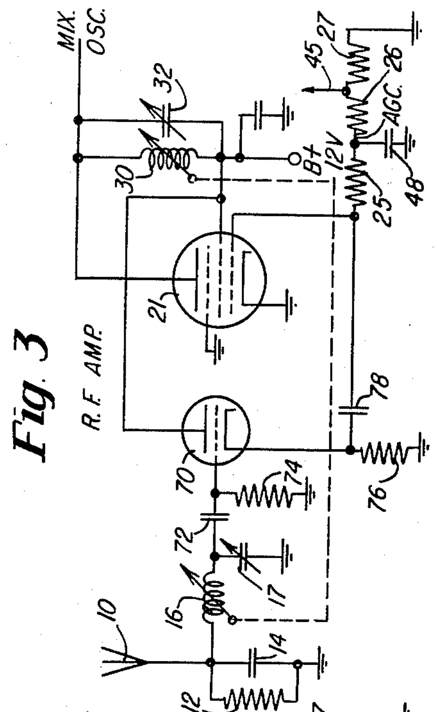
Fig. 3 is a diagram of a still further modification of the invention.

In Fig. 3 there is shown a further form of the invention using a triode vacuum tube for reducing the signal input level. The signal is applied to the control grid of triode 70 through capacitor 72 and the control grid is connected to ground through resistor 74. The anode of tube 70 is connected to the B+ potential and the cathode thereof is grounded through load resistor 76. This forms a cathode follower circuit from which the radio frequency signals are taken and applied to the control grid of tube 21 through blocking capacitor 78. When the input signals are strong, rectification occurs in the grid-cathode circuit of tube 70 to develop a bias potential across resistor 74 and reduce the conduction of tube 70 thereby reducing the input signal to tube 21. This action, together with the action of the AGC potential applied from lead 45, holds the output signal from tube 21 within desired limits and prevents overload of the succeeding stages. Tubes 70 and 21 may be contained in a single envelope if the shielding therebetween is sufficient. It is obvious, of course, that the value of capacitor 72 and resistor 74 are chosen to provide rectification or self-biasing in the cathode follower circuit.

From the foregoing it may be seen that this invention provides an improved gain control system for a sensitive radio receiver which may at times be receiving very strong signals. As described, the invention has particular utility in an automobile receiver of the type operating directly from the auto electrical system, providing a potential on the order of 12 volts. By utilizing the invention it is possible to construct the receiver to have maximum sensitivity for weak signals without encountering distortion and overloading on strong signals. The invention involves comparatively simple circuitry which may be used to supplement the usual automatic gain control system of a receiver to provide highly satisfactory operation over very wide signal input ranges.

We claim:

1. In an amplitude modulation radio receiver, the combination of a radio frequency amplifier including an electron valve having an output electrode and a control electrode adapted to be biased by a control potential of given polarity for regulating the gain thereof, circuit means coupled to said output electrode for utilizing radio frequency signals from said electron valve and for producing a first gain control potential proportional to signal strength and having given polarity with respect to a reference point, a tuned input circuit for applying radio frequency signals to said control electrode including a capacitor through which signals are applied to said control electrode and first resistor means coupled from said control electrode to the reference point, means applying said first gain control potential through at least a portion of said resistor means to said control electrode, a rectifier diode, and second resistor means series coupled with said rectifier diode across at least a portion of said first resistor means to rectify a portion of the radio frequency signals and charge said capacitor means, said rectifier diode being poled to provide a second gain control potential of the given polarity with respect to the reference point at said control electrode for regulating the gain of said electron valve in cooperation with said first gain control potential.

2. In an amplitude modulation radio receiver the combination of a radio frequency amplifier including an electron valve having an output electrode and a control electrode adapted to be biased by a control potential of given polarity for regulating the gain thereof, circuit means coupled to said output electrode for utilizing radio frequency signals from said electron valve and for producing a first control potential, a tuned input circuit for applying radio frequency signals to said control electrode including a capacitor through which signals are applied to said control electrode and first resistor means coupled from said control electrode to a reference point, means applying said first control potential with the given polarity through at least a portion of said resistor means to said control electrode, a rectifier diode, second resistor means series coupled with said rectifier diode across at least a portion of said first resistor means, and further capacitor means coupled from said tuned input circuit to said rectifier diode to apply radio frequency signals to said diode in order to rectify a portion of the radio frequency signals and charge said further capacitor means to provide a second control potential of the given polarity for regulating the gain of said electron valve in cooperation with said first control potential.

3. In an amplitude modulation radio receiver the combination of a radio frequency amplifier including an electron valve having cathode, grid and anode electrodes, input means including a tuned circuit coupled through capacitor means to said grid electrode and providing a direct current path between a reference point and said capacitor means, means coupling said cathode electrode to the reference point, circuit means coupled to said anode electrode for utilizing a received signal and including automatic gain control circuit means with first resistor means connected to the reference point for developing a first control potential negative with respect to the reference point and variable with the strength of the carrier wave of a received signal, second resistor means coupled between said grid electrode and said first resistor means for applying the first control potential to said grid electrode, a rectifier coupled across at least a portion of said second resistor means to charge said capacitor means by rectification of a received signal and thereby to develop a second control potential across said first and second resistor means, said rectifier being poled so that said second potential is negative with respect to the reference point whereby said second potential is added to said first control potential for increasing the bias of said electron valve in proportion to the strength of a received signal.

4. The combination of claim 3 which includes third resistor means series coupled with said rectifier across said portion of said second resistor means to reduce the effect of said rectifier on signals of low amplitude.

References Cited in the file of this patent

UNITED STATES PATENTS

| | | |
|---|---|---|
| 2,135,561 | Connell | Nov. 8, 1938 |
| 2,289,840 | Hertz | July 14, 1942 |
| 2,434,929 | Holland | Jan. 27, 1948 |

OTHER REFERENCES

Radiotron Designers Handbook, 4th edition, pages 1082–1083.